United States Patent
Nagle et al.

(10) Patent No.: US 6,891,432 B2
(45) Date of Patent: May 10, 2005

(54) APPARATUS, METHODS AND ARTICLES OF MANUFACTURE FOR ELECTROMAGNETIC PROCESSING

(75) Inventors: Pierce Joseph Nagle, Cork City (IE); Finbarr Joseph McGrath, Westford, MA (US)

(73) Assignees: Mia-Com, Inc., Lowell, MA (US); Mia Com Eurotec, B.V., Blackrock (IE)

( * ) Notice: Subject to any disclaimer, the term of this patent is extended or adjusted under 35 U.S.C. 154(b) by 0 days.

(21) Appl. No.: 10/294,430

(22) Filed: Nov. 14, 2002

(65) Prior Publication Data

US 2004/0095191 A1 May 20, 2004

(51) Int. Cl.[7] ............................................... H03F 3/217
(52) U.S. Cl. .................... 330/251; 330/10; 330/124 R; 330/254; 330/275; 455/333; 455/341; 327/359
(58) Field of Search ............................. 330/10, 124 R, 330/254, 273, 251; 455/333, 326, 341; 327/359

(56) References Cited

U.S. PATENT DOCUMENTS

| | | | |
|---|---|---|---|
| 3,906,246 A | * | 9/1975 | Okeda ........................ 307/229 |
| 3,978,422 A | | 8/1976 | Rheinfelder |
| 4,415,862 A | * | 11/1983 | Kunugi ........................ 330/10 |
| 4,580,111 A | | 4/1986 | Swanson |
| 4,586,000 A | | 4/1986 | Wagner |

(Continued)

FOREIGN PATENT DOCUMENTS

| | | | | |
|---|---|---|---|---|
| EP | 1 096 670 A2 | 5/2001 | ............. | H03F/1/32 |
| WO | WO 01/10013 A1 | 2/2001 | | |

OTHER PUBLICATIONS

IEEE Standard Dictionary of Electrical + Electronics Terms 1984 p. 197.*

Hulick, "The Digital Linear Amplifier", Schwenksville, Pennsylvania, Dated at least one year before applicant's invention.

KOZYREY, "Single–Ended Switching–Mode Tuned Power Amplifier with Filtering Circuit", Poluprovodnikovye pribory v tekhnike svyazi, 1971, pp. 152–166, vol. 6.

TimeStar™, "Multi–Mode Polar Modulator" 2002, Tropian Headquarters, USA.

Sundstrom, "Digital RF Power Amplifier Linearisers", 1995, Sweden.

(Continued)

*Primary Examiner*—Michael B. Shingleton

(57) ABSTRACT

Apparatus, methods and articles of manufacture are shown for modifying electromagnetic waves. Through using various wave characteristics such as amplitude to regulate a current source, a current is output that may be used in any number of ways, such as driving an antenna or other load.

12 Claims, 2 Drawing Sheets

U.S. PATENT DOCUMENTS

| | | |
|---|---|---|
| 4,646,359 A | 2/1987 | Furrer |
| 5,278,997 A | 1/1994 | Martin |
| 5,311,143 A | 5/1994 | Soliday |
| 5,410,280 A | 4/1995 | Linguet et al. |
| 5,642,002 A | 6/1997 | Mekanik et al. |
| 5,774,017 A | 6/1998 | Adar |
| 5,818,298 A | 10/1998 | Dent et al. |
| 5,867,778 A * | 2/1999 | Khoury et al. ............... 455/333 |
| 5,880,633 A | 3/1999 | Leizerovich et al. |
| 5,892,431 A | 4/1999 | Osterman |
| 5,930,128 A | 7/1999 | Dent |
| 5,939,951 A | 8/1999 | Bateman et al. |
| 5,942,946 A | 8/1999 | Su et al. |
| 5,952,895 A | 9/1999 | McCune, Jr. et al. |
| 6,043,707 A | 3/2000 | Budnik |
| 6,043,712 A | 3/2000 | Leizerovich et al. |
| 6,075,413 A | 6/2000 | Katakura |
| 6,078,628 A | 6/2000 | Griffith et al. |
| 6,094,101 A | 7/2000 | Sander et al. |
| 6,097,252 A | 8/2000 | Sigmon et al. |
| 6,101,224 A | 8/2000 | Lindoff et al. |
| 6,112,071 A | 8/2000 | McCune, Jr. |
| 6,133,788 A | 10/2000 | Dent |
| 6,140,875 A | 10/2000 | Van Den Homberg et al. |
| 6,140,882 A | 10/2000 | Sander |
| 6,147,553 A | 11/2000 | Kolanek |
| 6,157,681 A | 12/2000 | Daniel et al. |
| 6,191,653 B1 | 2/2001 | Camp, Jr. et al. |
| 6,198,347 B1 | 3/2001 | Sander et al. |
| 6,201,452 B1 | 3/2001 | Dent et al. |
| 6,215,355 B1 | 4/2001 | Meck et al. |
| 6,219,394 B1 | 4/2001 | Sander |
| 6,236,284 B1 | 5/2001 | Duello et al. |
| 6,242,975 B1 | 6/2001 | Eidson et al. |
| 6,246,286 B1 | 6/2001 | Persson |
| 6,255,906 B1 | 7/2001 | Eidson et al. |
| 6,259,901 B1 | 7/2001 | Shinomiya et al. |
| 6,269,135 B1 | 7/2001 | Sander |
| 6,285,251 B1 | 9/2001 | Dent et al. |
| 6,288,916 B1 | 9/2001 | Liu et al. |
| 6,294,957 B1 | 9/2001 | Luu |
| 6,311,046 B1 | 10/2001 | Dent |
| 6,317,608 B1 | 11/2001 | Glöcker |
| 6,321,072 B1 | 11/2001 | Cipriani et al. |
| 6,323,731 B1 | 11/2001 | McCune, Jr. |
| 6,356,155 B1 | 3/2002 | Judkins |
| 6,366,177 B1 | 4/2002 | McCune et al. |
| 6,369,657 B2 | 4/2002 | Dening et al. |
| 6,377,784 B2 | 4/2002 | McCune |
| 6,380,802 B1 | 4/2002 | Pehike et al. |
| 6,404,823 B1 | 6/2002 | Grange et al. |
| 6,411,655 B1 | 6/2002 | Holden et al. |
| 6,426,677 B1 | 7/2002 | Prentice |
| 6,426,678 B1 | 7/2002 | Ko |
| 6,430,402 B1 | 8/2002 | Agahi-Kesheh |
| 6,445,247 B1 | 9/2002 | Walker |
| 6,449,465 B1 | 9/2002 | Gailus et al. |
| 6,509,825 B1 * | 1/2003 | Smit et al. ................... 340/5.2 |

OTHER PUBLICATIONS

Kenington, "Linearised RF Amplifier and Transmitter Techniques", Microwave Engineering Europe, Nov. 1998, pp. 35–42.

Mann, et al., "Increasing Talk–Time with Efficient Linear PAs", Presented at IEE Colloquim on Tetra Market and Technology Developments, Feb. 2000, London.

Mann, et al., "Increasing Talk–Time of Mobile Radios with Efficient Linear Transmitter Architectures", Electronics & Communication Engineering Journal, Apr. 2001, pp. 65–76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131–133, vol. 35, No. 2.

Tropian–Products Main, www.tropian.com/products/, Copyright 2000–2001, Aug. 14, 2002.

"Tropian and Agilent Technologies announce collaboration on multi–band, multi–mode 2.5G transmitter solutions", Feb. 18, 2002, Connes, France.

"Tropian Awarded 8$^{th}$ U.S. Patent for Wireless Technology: Innovative RF Power Processing Circuit Architecture Achieves Speed and Accuracy in Polar Modulation," Aug. 6, 2001, Cupertino, California.

Dialog Web Command Mode, p. 1 of 1, Sep. 17, 2002, Record 03929207, Polar Modulators for 1 and 2 GHz Power Amplifier Correction, Nisbet, J.

Dialog Web Command Mode, p. 1 of 1, Sep. 17, 2002, Record 0326082, A new Class–AB Design, De Jager, et al., Electronics World 105, Dec. 1999, p. 982–987.

Dialog Web Command Mode, p. 1 of 1, Sep. 17, 2002, Record 2371235, Increasing the talk–time of mobile radios with efficient linear transmitter architectures, Mann et al., Electronics & Communication Engineering Journal, v. 13, No. 2, Apr. 2001 (p. 65–76).

Dialog Web Command Mode, p. 1 of 3, Sep. 17, 2002, Record 15595216, The big climate amplifier ocean circulation–sea–storminess–dustiness–albedo, Broecker, Geophysical Monograph, 2001, 126, 53–56, etc.

Dialog Web Command Mode, p. 1 of 9, Sep. 19, 2002, Record 10872787, Out–of–band emissions of digital transmissions using Kahn EER technique, Rudolf, IEEE Transactions on Microwave Theory & Techniques, 2002, V 50, N 8, Aug. p. 1979–1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

* cited by examiner

APPARATUS, METHODS AND ARTICLES OF MANUFACTURE FOR ELECTROMAGNETIC PROCESSING

FIELD OF THE INVENTION

The invention relates generally to electromagnetic processing, and more particularly to the attenuation or amplification of electromagnetic waves.

BACKGROUND OF THE INVENTION

The controlled attenuation or amplification of electromagnetic waves has many uses. For example, intelligence may be conveyed along a wave by attenuating and/or amplifying ("modifying") electromagnetic wave characteristics, such as is seen when modulating amplitude, frequency or phase of an electrical current or radio frequency (RF) wave to transmit data. As another example, power may be conveyed along a wave in a controlled fashion by attenuating and/or amplifying electromagnetic wave characteristics, such as is seen when modulating voltage or current in a circuit. Moreover, the uses may be combined, such as when intelligence may be conveyed through a wave by modifying power characteristics.

Electromagnetic wave characteristic modification may be accomplished through digital or analog techniques. Digital and analog attenuation and/or amplification may also be combined, that is, the same wave may be subject to various types of digital and/or analog attenuation and/or amplification within a system in order to accomplish desired tasks.

However, modifying electromagnetic wave characteristics may be difficult. For example, choosing an appropriate technique or component to modify a wave characteristic may be difficult for a number of reasons. One of those reasons involves the type of wave to be modified. For example, low frequency waves, such as 60 Hz power waves, may need different modification techniques than high frequency waves such as 24 GHz radar waves. It is common practice therefore to use different components, with different characteristics, for different waves. For example, a switching semiconductor used within a computer for 60 Hz power waves has different power handling characteristics from a power semiconductor used in a 24 GHz radar system. However, it would be helpful to the art of electromagnetic wave modification by simplifying design techniques if similar or standardizing techniques and/or components could be used for a number of types of waves.

One attempt at standardizing techniques and components that has recently been used is to use characteristics of the wave as information to modify the wave. For example, by translating a wave into polar coordinates with amplitude and phase characteristics, either or both characteristics may be used and/or manipulated in such a manner so as to provide standardized techniques for various wave frequencies. However such attempts to date have been constrained by application difficulties. For example, attempts which use multiple amplifiers have suffered from difficulties attendant to amplifier combining. Specifically, components, such as transformers or quarter wave lines, are used to sum the output of the amplifiers in order to drive the load. These components add to the cost and size of the amplifier array.

Accordingly, it would be helpful to the art of electromagnetic processing if wave characteristics could be used in order to attenuate and/or amplify a wave in an efficient manner.

SUMMARY OF THE INVENTION

Embodiments of the present invention include apparatus, methods and articles of manufacture for modifying electromagnetic waves. Preferred embodiments utilize characteristics of the waves to modify the waves, and provide techniques and/or components for modification of various types of waves. In these embodiments, two or more independently controllable current sources are used to generate an output wave that is a modification of an input wave. Those current sources are regulated by characteristics of the input wave.

DETAILED DESCRIPTION OF THE PREFERRED EMBODIMENTS

Embodiments of the present invention include apparatus, methods and articles of manufacture for attenuation and/or amplification ("modification") of electromagnetic waves according to characteristics of the waves.

Figure 1:
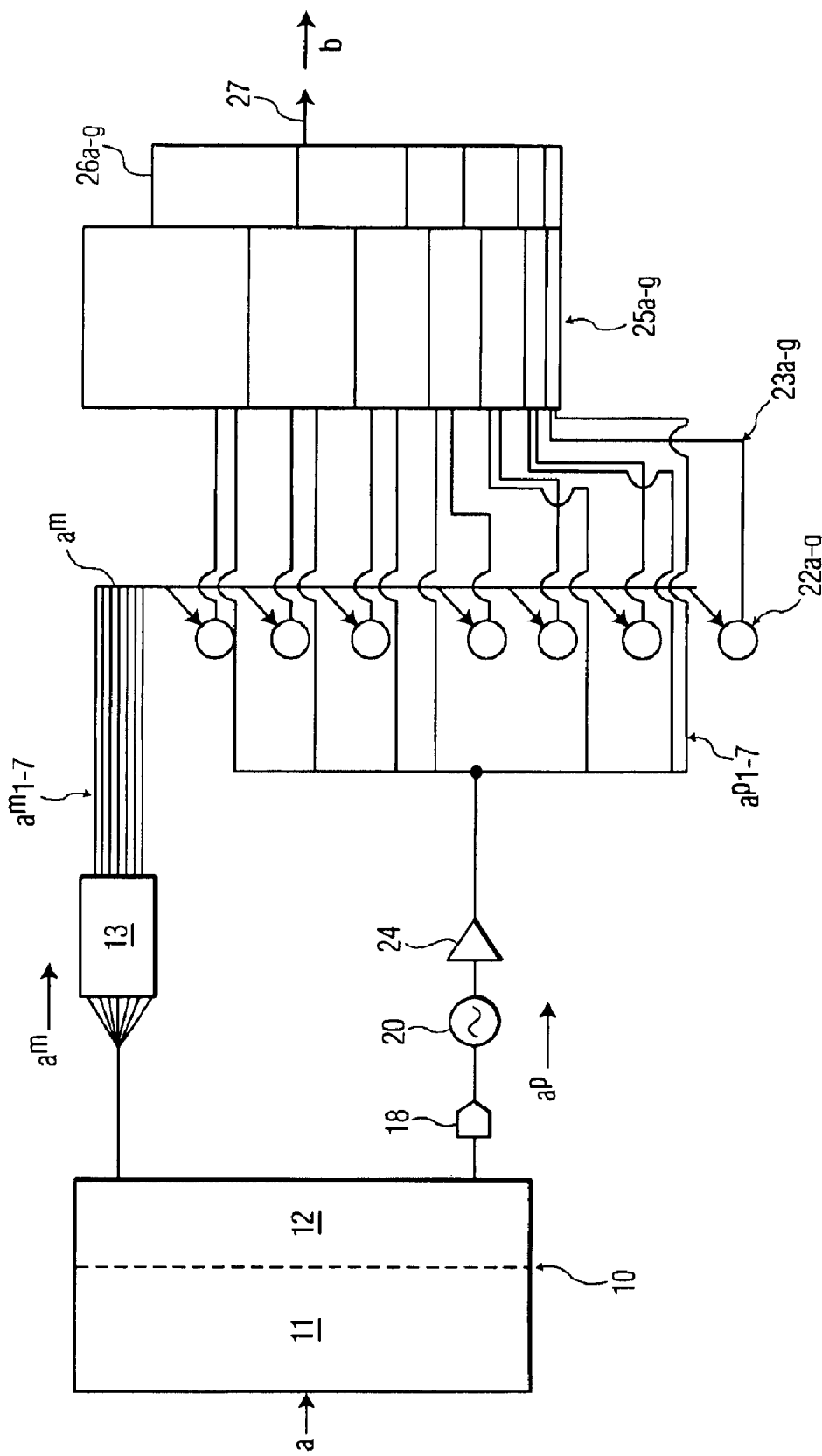
FIG. 1 shows a preferred embodiment.

FIG. 1 shows a preferred embodiment. An input wave a is provided to a Digital Signal Processor 10. Digital Signal Processor 10 comprises an Analog to Digital Converter 11, which digitizes the wave, for example, by the use of rectangular coordinates or I,Q data. Rectangular to Polar Converter 12 then receives the I,Q data and translates it into polar coordinates. It should be noted that, in other embodiments, a digitized representation of a wave may be provided to a rectangular to polar converter if desired. In those embodiments, the digitized representation may be generated in any of a number of ways as is known in the art. Also, while this embodiment is described as used in connection with a digitized wave and I,Q and polar data, those of ordinary skill in the art will appreciate that other embodiments are not limited thereto and may use any digital or analog wave form, or combination thereof.

Returning now to the embodiment of FIG. 1, Rectangular to Polar Converter 12 outputs a digitized wave in polar coordinates, which takes the form R, P(sin) and P(cos) for example. In this example, the R coordinate represents the amplitude characteristic of the wave. The P(sin) and P(cos) coordinates represent the phase characteristic of the wave. It should be noted that "characteristic," as used herein, refers to electromagnetic wave characteristics, such as frequency, voltage, amplitude (including magnitude and envelope), phase, current, wave shape, or pulse. Other embodiments may derive one or more wave characteristics from the input wave as desired.

Figure 2:
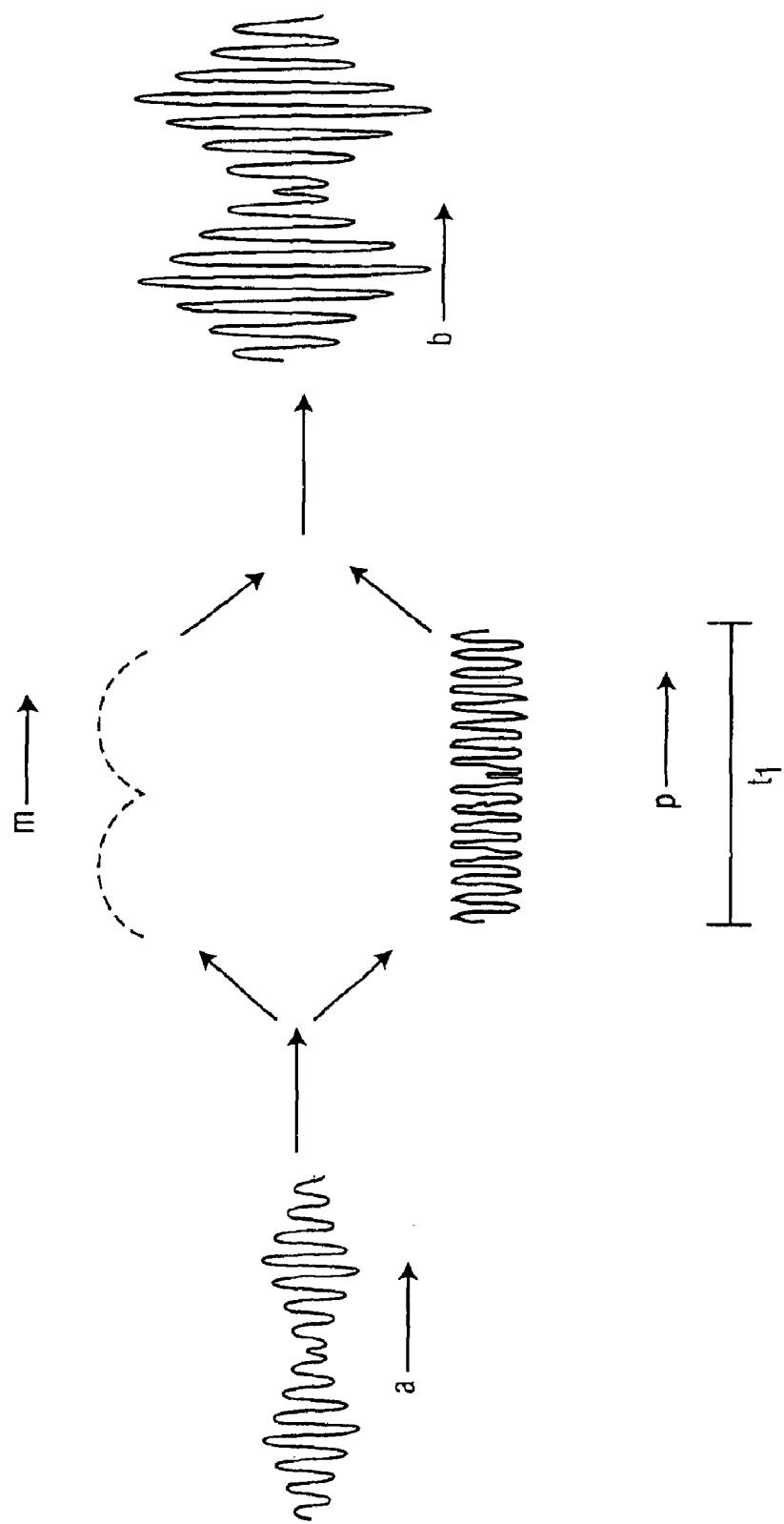
FIG. 2 shows a schematic diagram of operation of the embodiment of FIG. 1.

Turning briefly to FIG. 2, a schematic diagram of a wave that has been translated according to the embodiment of FIG. 1 is shown. Input wave a has been translated into magnitude component m comprising magnitude characteristics of the input wave over period $t_1$ and phase component p comprising phase characteristics on a carrier wave over the same period. Output wave b is shown after amplification by a preferred embodiment. It should be noted that the time period in this and other embodiments is as desired. For example, embodiments may derive magnitude and phase characteristics of a wave using various sampling rates in order to maximize resolution of the wave, maximize speed of operation, etc. These sampling rates may be dynamically determined as well in various embodiments so that they change during operation. In the preferred embodiments, the division of an input wave is synchronized, in order to maximize accuracy of output and minimize any distortion.

Returning now to FIG. 1, amplitude and phase characteristics are then transmitted through separate paths. The amplitude characteristics of the input wave are converted, via converter 13, along path $a^m$, into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input wave. The digital word provides control for attenuation and/or amplification, in manner to be described further below. Of course, as is described further below, in other embodiments, a differently composed digital word may be used, as well as other types of derivation and/or provision of amplitude or other wave characteristics.

In the embodiment of FIG. 1, seven control component lines $a^m1$–$a^m7$ are shown leading away from the converter 13. The number of these control component lines depends, in the preferred embodiments, upon the resolution of the word. In this preferred embodiment, the word has a seven bit resolution. It should be noted in FIG. 1 that, for ease of viewing the figure, the control component lines are consolidated into a single path $a^m$ leading into control components 22a–g. However, in the embodiment, and as further described below, the control component lines are not consolidated and instead feed into the control components individually.

The phase characteristic travels along path $a^p$. Here the phase characteristic is first modulated onto a wave by way of Digital to Analog Converter 18 and Synthesizer 20 (which is a Voltage Controlled Oscillator in an especially preferred embodiment.) Synthesizer 20 provides an output wave, which is comprised of the phase information. This output wave has a constant envelope, i.e., it has no amplitude variations, yet it has phase characteristics of the original input wave, and passes to driver 24, and in turn driver lines $a^p1$–$a^p7$. The wave, which has been split among the driver lines, is then fed into current sources 25a–25g, and will serve to potentially drive the current sources 25a–25g as is further described below. In other embodiments, other sources of other wave characteristics, i.e., besides the phase characteristic, may be used.

It should be noted that, in the present embodiment, transistors may be used as current sources 25a–25g. Additionally, in other embodiments, one or more transistors segmented appropriately may be used as current sources 25a–25g. The current sources 25a–25g must not be configured to behave like voltage sources; for example, by saturating transistors, which will interfere with the desired current combining of the sources.

Path $a^m$ (comprised of control component lines $a^m1$–$a^m7$ as described above) terminates in control components 22a–g. In the especially preferred embodiment, these are switching transistors, and are preferably current sources, although, as further described below, in other embodiments, other sources of other wave characteristics may be used, as well as other regulation schemes. Control components 22a–g are switched by bits of the digital word output from the amplitude component and so regulated by the digital word output from the amplitude component. If a bit is "1" or "high," the corresponding control component is switched on, and so current flows from that control component to appropriate current source 25a–g along bias control lines 23a–g. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 25a–g receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Returning now to the embodiment of FIG. 1, each current source serves as a potential current source, and is capable of generating a current, which is output to current source lines 26a–g respectively. Each current source may or may not act as a current source, and so may or may not generate a current, because it is regulated via the appropriate digital word value regulating a control component. Activation of any current source, and generation of current from that current source, is dependant upon the value of the appropriate bit from the digital representation of the amplitude component regulating the appropriate control component.

It should be noted that the current sources are not an amplifier or amplifiers in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates.

The combined current, i.e. the sum of any current output from current sources 25a–g, is the current sources output. Thus the embodiment may act as an attenuator and/or amplifier. No further circuitry or components are necessary between the current sources to combine current from each current source and so provide a useful output current. Therefore, the combined current, which is output on line 27, and shown as b, may be used as desired, e.g., as an amplifier, as an attenuator, to drive a load, etc.

In the preferred embodiments, the current sources vary in current output and size. This provides various weighting to the currents that are potentially supplied by those current sources. For example, in one preferred embodiment, a first current source is twice the size of a next current source, which in turn is twice the size of a next current source, and so on until a final current source. The number of current sources may be matched to the number of bits of the digital control word, so that the largest current source is controlled by the MSB of the amplitude word, the next bit of the word controls the next largest current source, etc., until the LSB, which is sent to the smallest current source. Of course, as had been noted above, other embodiments may have a different pattern of matching bit to current source, including use of a switching network. Moreover, in an especially preferred embodiment, duplicate current sources— of the same size— are provided, as well as current sources that vary in size. In yet other embodiments, other wave characteristics may be provided to other current sources and so regulate those sources.

The current sources 25a–g are, in the preferred embodiment of FIG. 1, one or more HBT transistors. Other transistors may be used as well, such as FETs, etc., as well as other current sources. Other components may be interposed as well, e.g., a variable gain amplifier or attenuator to reduce the drive current to the transistor segments, non-linear components along the amplitude path, etc.

In accordance with the preferred embodiments, the amplitude characteristic is preferably digitized. In one embodiment, the peak amplitude is set equal to the full scale of the digitization (i.e. when all bits are set high). Alternatively, the peak amplitude may be set to other than the full scale (i.e. greater or lesser) of the digitization. If the peak amplitude is set lesser than the full scale, an increase in gain may exist because the average output power level is increased for a given power level of the phase modulated carrier signal.

The use of the preferred embodiments may provide a capability for wide band amplitude modification in an associated transmitter because it makes possible linear amplification and/or attenuation across a relatively large envelope bandwidth, due to the relatively low input capacitance. Thus, embodiments may be used in cellular and other transmitters, as is described further herein.

As should be understood, any suitable types of current sources, for example, other transistor segments and/or formats as well as other devices or methods, may be used with any of the embodiments of the present invention where desired. In the preferred embodiments, fabricated as a single integrated circuit, weighting may be achieved by providing segments having different semiconductor areas.

In addition, preferred embodiments may include amplifiers that are specialized for particular input waves and output waves, e.g. embodiments may be used in various RF, microprocessor, microcontroller and/or computer devices, e.g. cell phones, such as CDMA, CDMA2000, W-CDMA, GSM, TDMA, as well as other wired and wireless devices, e.g. Bluetooth, 802.11a, -b, -g, radar, 1xRTT, two-way radios, GPRS, computers and computer communication devices, PDA's and other handheld devices, etc.

Various embodiments may modify various parameters without departing from the spirit and scope of the present invention. For example, the length of the digital word may be longer or shorter in various embodiments, which may provide a more or less precise digitization of the wave. As other examples, as was described further above, the number of bits, control components, control component lines, driver lines, bias control lines, current sources, etc., may all be varied as desired.

Various types of system architectures may be utilized for constructing the embodiments of the present invention. One of ordinary skill in the art will accordingly appreciate that embodiments of the invention or various components and/or features thereof may be entirely comprised of hardware, software or may be a combination of software and hardware. The embodiments or various components may also be provided on a semiconductor device where desired, such as an integrated circuit or an application-specific integrated circuit composition; some examples include silicon (Si), silicon germanium (SiGe) or gallium arsenide (GaAs) substrates.

While the invention has been described by illustrative embodiments, additional advantages and modifications will occur to those skilled in the art. Therefore, the invention in its broader aspects is not limited to specific details shown and described herein. Modifications may be made without departing from the spirit and scope of the invention. Accordingly, it is intended that the invention not be limited to the specific illustrative embodiments, but be interpreted within the full spirit and scope of the appended claims and their equivalents.

We claim:

1. An apparatus for electromagnetic processing comprising:
   a digital to analog converter and a polar converter for providing an amplitude characteristic and a phase characteristic in synchronization;
   a transistor capable of generating a current with at least two independently controllable current sources, for receiving said amplitude characteristic and said phase characteristic.

2. An apparatus as in claim 1 wherein said transistor generates a current.

3. A method for electromagnetic processing comprising:
   regulating at least two independently controllable current sources with at least one wave characteristic wherein said at least two independently controllable current sources are capable of generating a current;
   wherein said regulating of said at least two independently controllable current sources comprises providing said wave characteristic to a second current source, wherein said second current source is capable of generating a current, and upon generating a current, regulates at least one of said at least two independently controllable current sources.

4. A method as in claim 3, wherein said at least one wave characteristic is an amplitude characteristic.

5. A method as in claim 3, wherein said wave characteristic is comprised of a first wave characteristic and second wave characteristic and further comprising providing said first wave characteristic and second wave characteristic to said at least two independently controllable current sources.

6. A method as in claim 5, wherein said second wave characteristic is a phase characteristic.

7. A method as in claim 5, further comprising providing said first wave characteristic and said second wave characteristic via a converter.

8. A method as in claim 5, further comprising providing said first wave characteristic and said second wave characteristic via a polar converter.

9. A method as in claim 5, further comprising providing said first wave characteristic and said second wave characteristic via a digital to analog converter.

10. An apparatus for electromagnetic processing comprising:
    means for regulating at least two independently controllable current sources with at least one wave characteristic, wherein said at least two independently controllable current sources are capable of generating a current; and
    means for providing said wave characteristic to a second current source wherein said second current source is capable of generating a current, and upon generating a current, regulates at least one of said at least two independently controllable current sources.

11. An apparatus as in claim 10, wherein said at least one wave characteristic is an amplitude characteristic.

12. A method as in claim 3, wherein said second current source is comprised of a plurality of independently controllable current sources.

* * * * *